United States Patent
Cho et al.

(10) Patent No.: US 6,998,309 B2
(45) Date of Patent: Feb. 14, 2006

(54) METHOD OF MANUFACTURING A NON-VOLATILE SEMICONDUCTOR MEMORY DEVICE

(75) Inventors: In-Wook Cho, Yongin-si (KR); Nae-In Lee, Seoul (KR); Kwang-Wook Koh, Sungnam-si (KR); Geum-Jong Bae, Suwon-si (KR); Sang-Su Kim, Suwon-si (KR); Jin-Hee Kim, Sungnam-si (KR); Sung-Ho Kim, Gyeonggi-do (KR); Ki-Chul Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 12 days.

(21) Appl. No.: 10/786,239

(22) Filed: Feb. 24, 2004

(65) Prior Publication Data
US 2005/0186734 A1    Aug. 25, 2005

(30) Foreign Application Priority Data
Feb. 24, 2003   (KR)   .................... 10-2003-0011309

(51) Int. Cl.
*H01L 21/336*   (2006.01)

(52) U.S. Cl. .................. 438/257; 438/283; 438/954
(58) Field of Classification Search ............... 438/142, 438/257, 258, 275, 283, 954, 981
See application file for complete search history.

(56) References Cited

U.S. PATENT DOCUMENTS 6,861,699 B2 *   3/2005   Kim ........................... 257/316

* cited by examiner

*Primary Examiner*—Phuc T. Dang
(74) *Attorney, Agent, or Firm*—Volentine Francos & Whitt PLLC (57) ABSTRACT

A method of manufacturing a non-volatile semiconductor memory device begins by forming a dielectric layer pattern having an ONO composition on a substrate. A polysilicon layer is formed on the substrate including over the dielectric layer pattern. The polysilicon layer is patterned to form a split polysilicon layer pattern that exposes part of the dielectric layer pattern. The exposed dielectric layer is etched, and then impurities are implanted into portions of the substrate using the split polysilicon layer pattern as a mask to thereby form a source region having a vertical profile in the substrate.

21 Claims, 11 Drawing Sheets

METHOD OF MANUFACTURING A NON-VOLATILE SEMICONDUCTOR MEMORY DEVICE

BACKGROUND OF THE INVENTION

1. Field of the Invention

The present invention relates to a method of manufacturing a non-volatile semiconductor memory device. More particularly, the present invention relates to a method of manufacturing a non-volatile semiconductor memory device that includes a silicon oxide-nitride-oxide semiconductor (SONOS) or a metal oxide-nitride-oxide semiconductor (MONOS) memory cell having a split structure.

2. Description of the Related Art

Generally, semiconductor memory devices can be divided into volatile semiconductor memory devices, such dynamic random access memory (DRAM) devices or static random access memory (SRAM) devices, and non-volatile semiconductor memory devices, such as electrically erasable programmable read only memory (EEPROM) devices. Data stored in the volatile memory devices is lost once power to the devices is interrupted, whereas the non-volatile memory devices can maintain stored data for a predetermined period even after power to the devices is interrupted.

Non-volatile memory devices rely on Fowler-Nordheim (F-N) tunneling or the hot-carrier injection of thermal electrons to control the input or output of data. More specifically, the programming of a non-volatile memory device is initiated by impressing positive voltage across a control gate of the device. The positive voltage is coupled to a floating gate to thereby cause electrons to be captured by the floating gate. On their way to the floating gate, the electrons pass through a tunnel oxide layer on a substrate by means of F-N tunneling or hot-carrier injection. On the other hand, the erasing of the non-volatile memory device entails impressing a negative voltage across the control gate so that electrons in the floating gate move toward the substrate. The response speed of the non-volatile memory device corresponds to the coupling ratio. Here, the term "coupling ratio" refers to the ratio of the voltage applied to the control gate and the voltage coupled to the floating gate during the programming operation.

Non-volatile semiconductor devices have been recently employing a floating gate structure and a metal insulator semiconductor (MIS) structure having two or three dielectric layers. An EEPROM tunnel oxide (ETOX) structure is a well-known floating gate structure in which the programming and erasing operations are carried out using a potential well. Meanwhile, MONOS and SONOS structures are widely known MIS structures in which the programming and erasing operations are performed using a trap existing in a dielectric bulk, i.e., at the boundary between two dielectric layers or at the boundary between a dielectric layer and a semiconductor substrate. Korean Laid-Open Patent Publication No. 2003-57897 discloses a non-volatile semiconductor memory device including an SONOS memory cell.

Figure 1:
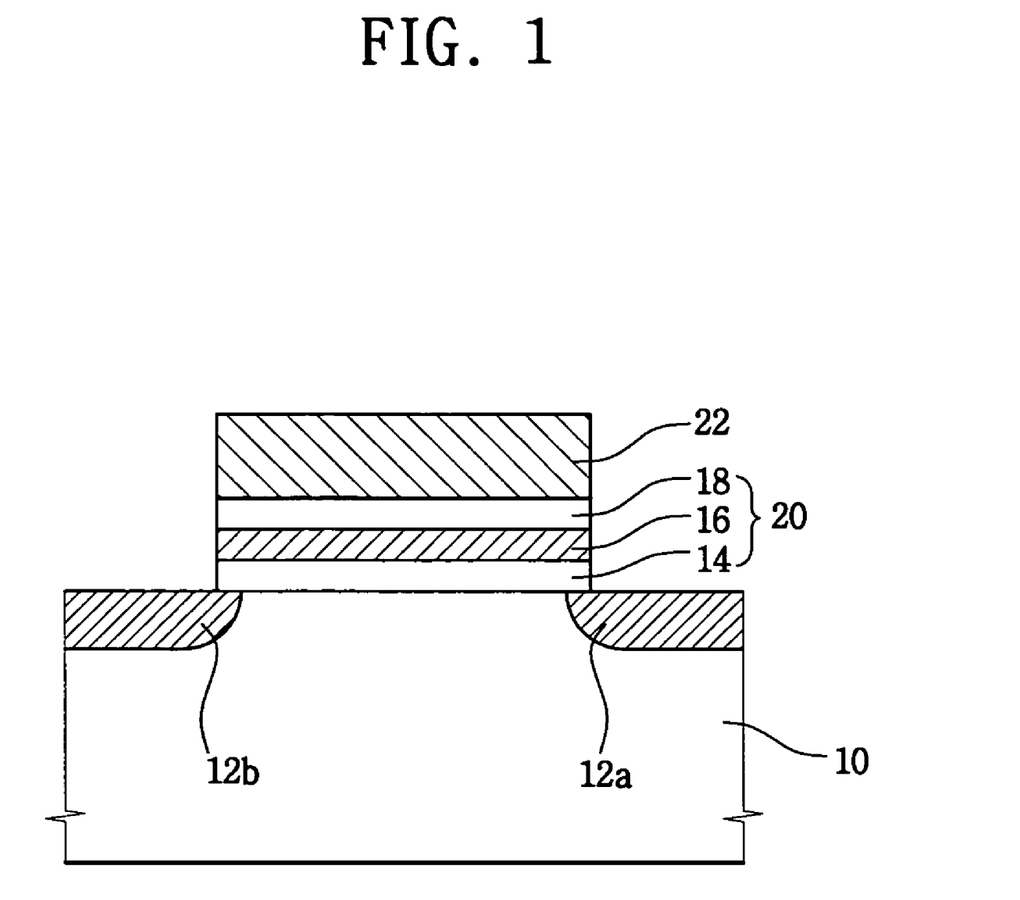
FIG. 1 is a cross-sectional view of a conventional SONOS memory cell of a non-volatile semiconductor memory device.

FIG. 1 illustrates such a conventional SONOS memory cell of a non-volatile semiconductor memory device.

Referring to FIG. 1, a gate structure of the SONOS memory cell includes a dielectric layer 20 formed on a semiconductor substrate 10, and a polysilicon layer 22 formed on the dielectric layer 20. The polysilicon layer 22 constitutes a control gate of the non-volatile semiconductor memory device. Source/drain regions 12a and 12b are formed at portions of the substrate 10 adjacent to the gate structure.

The dielectric layer 20 has an oxide-nitride-oxide (ONO) structure in which a first oxide film 14, a nitride film 16 and a second oxide film 18 are disposed one atop the other on the substrate 10. The first oxide film 14 serves as a tunneling oxide film and the second oxide film 18 functions as a blocking oxide film.

Although the above-described non-volatile semiconductor memory device including the SONOS memory cell is relatively small, the non-volatile semiconductor memory device may have relative high threshold voltage (Vth) and programming current because the dielectric layer of the ONO structure is situated on a channel region of the substrate where the gate structure is located. Additionally, an incomplete erasing of data may occur in the SONOS memory cell.

Japanese Laid-Open Patent Publication No. 2000-201115 discloses a non-volatile semiconductor memory device having an improved SONOS memory cell that aims to overcome such problems. And, U.S. Pat. No. 6,011,725 discloses a non-volatile semiconductor memory device having a split-structured SONOS memory cell in which a dielectric layer is formed beneath a control gate.

FIGS. 2A to 2F illustrate a conventional method of manufacturing a non-volatile semiconductor memory device having a split-structured SONOS memory cell.

Figure 2A:
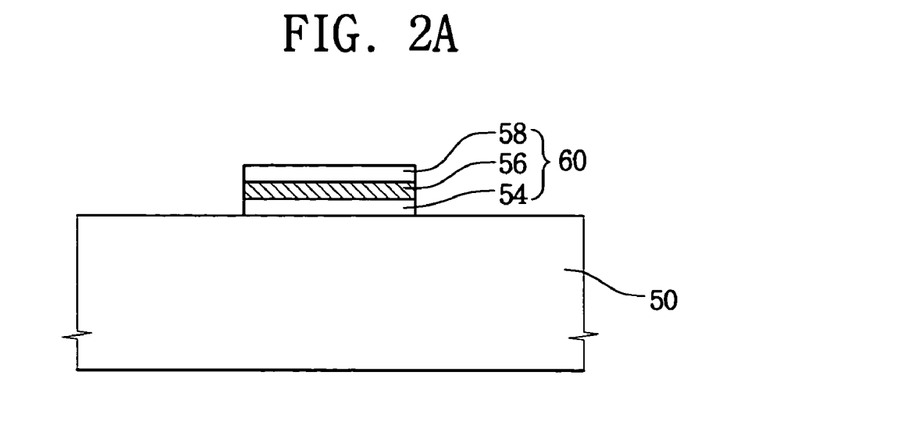
FIGS. 2A to 2F are cross-sectional views of a substrate, illustrating a conventional method of manufacturing a non-volatile semiconductor memory device having a split-structured SONOS memory cell.
Figure 2B:
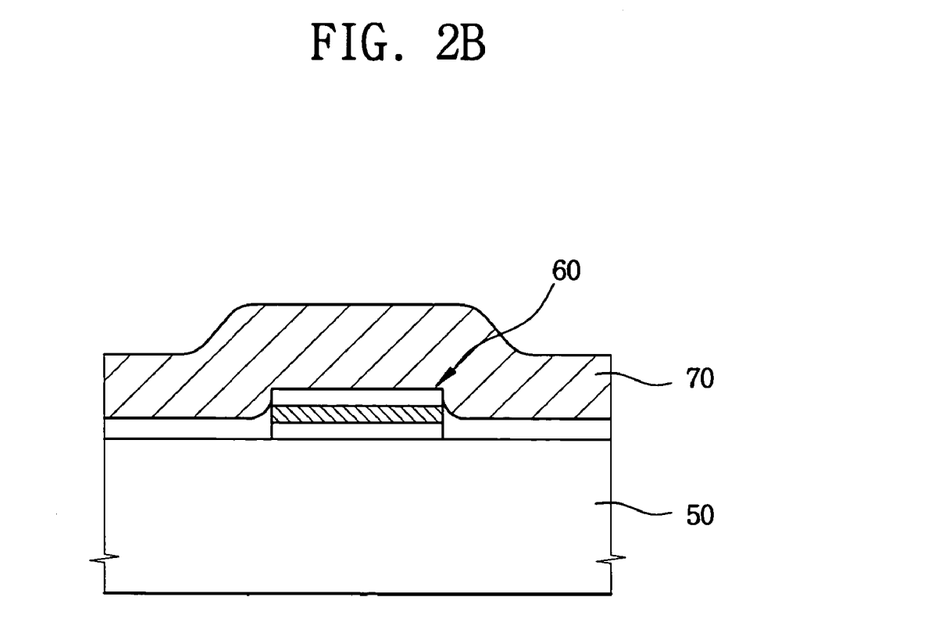

Referring to FIGS. 2A and 2B, a dielectric layer pattern 60 having an ONO structure is formed on a substrate 50. The dielectric layer pattern 60 includes a first oxide film 54, a nitride film 56 and a second oxide film 58 successively formed on the substrate 50. The dielectric layer pattern 60 traps electrons in the memory cell of the non-volatile semiconductor memory device.

Next, a polysilicon layer 70 is formed on the dielectric layer pattern 60 and on the substrate 50.

Figure 2C:
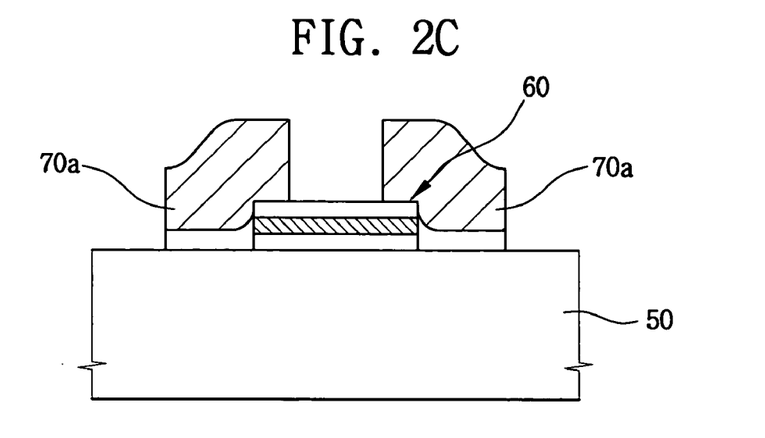
Figure 2D:
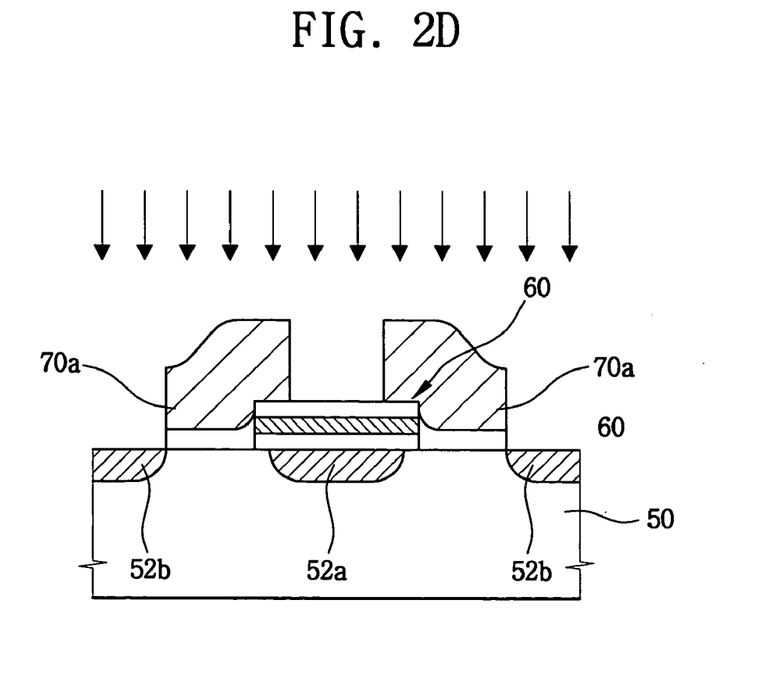

Referring to FIGS. 2C and 2D, after an etching mask (not shown) is formed on the polysilicon layer 70, the polysilicon layer 70 is patterned using the etching mask to thereby form a polysilicon layer pattern 70a. The polysilicon layer pattern 70a has a split structure, and exposes a predetermined portion of the dielectric layer pattern 60. In this case, the polysilicon layer pattern 70a serves as a control gate of the split-structured memory cell.

The etching mask is removed. Preliminary source/drain regions 52a and 52b are then formed on the substrate 50 by implanting impurities into the substrate 50 using the polysilicon layer pattern 70a as a mask. At this time, the preliminary source region 52a may be rather wide because the ion implantation process for forming the source/drain regions 52a and 52b must be carried out with a relatively high energy considering that the impurities must penetrate the dielectric layer pattern 60.

Figure 2E:
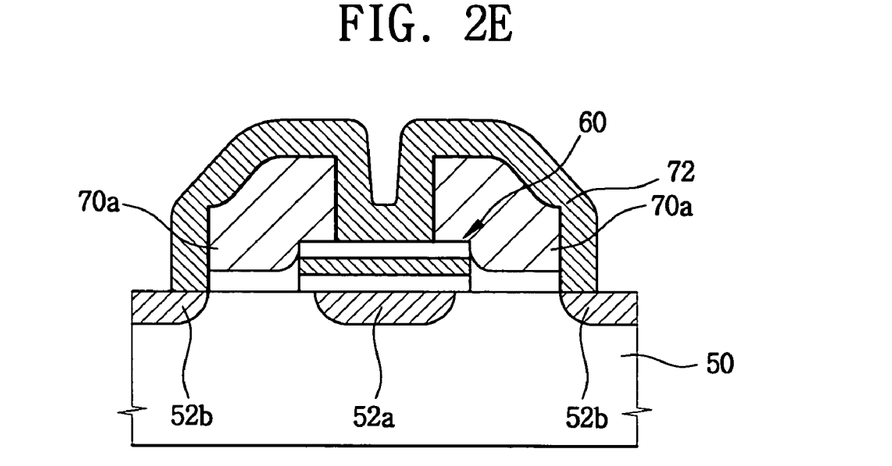
Figure 2F:
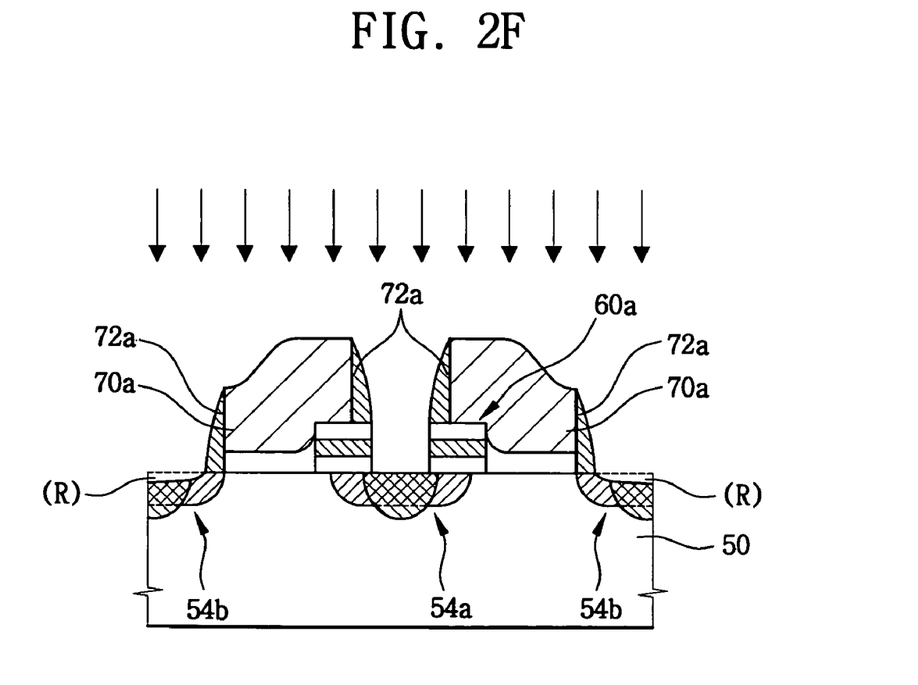

Referring to FIGS. 2E and 2F, a nitride layer 72 is formed on the substrate 50. Then, the nitride layer is etched using an etch back process to thereby form a spacer 72a on the sidewall of the polysilicon layer pattern 70a. At this time, the dielectric layer pattern 60 is to be separated into two parts 60a by the etch back process. Thus, a portion of the substrate 50 including the drain region 52b may be over-etched during the etch back process, thereby creating a defect such as a recess R on the substrate 50.

Finally, impurities are implanted into the substrate 50 using the polysilicon layer pattern 70a and spacer 72a as a mask to form lightly doped structures 54a and 54b in the preliminary source/drain regions 52a and 52b of the substrate 50.

However, in the non-volatile semiconductor memory device having the above-described SONOS memory cell, the width of the channel region of the SONOS memory cell is relatively small and the programming efficiency of the non-volatile semiconductor memory device is mediocre because the source region 52a has a relatively large width and inclined profile. Additionally, leakage current may occur at the drain region due to the defect, such as the recess R, created as the result of the over-etching of the substrate during the etch back process used to split the gate structure. Accordingly, a non-volatile semiconductor memory device manufactured according to the above-described conventional method is not so reliable.

SUMMARY OF THE INVENTION

One feature of the invention is to provide a method of manufacturing an efficiently programmable non-volatile semiconductor device.

Another feature of the invention is to provide a method of manufacturing a non-volatile semiconductor device that produces minimal leakage current at source/drain regions.

In accordance with one aspect, the present invention provides a method of manufacturing a non-volatile semiconductor memory device having a split gate structure, wherein the dielectric layer is etched before ions are implanted into the substrate.

First, a dielectric layer pattern is formed on the substrate. Then, a gate layer, preferably a polysilicon layer, is formed on the substrate including over the dielectric layer pattern. The polysilicon layer is patterned to form a split polysilicon layer pattern on the dielectric layer pattern. Accordingly, a portion of the dielectric layer pattern is exposed. The exposed portion of the dielectric layer is then etched. Preferably, only an upper part of the exposed portion of the dielectric layer pattern is removed such that a lower part of the exposed portion of the dielectric layer pattern is left on the substrate. Impurities are then implanted into the substrate using the split polysilicon layer pattern as a mask.

According to another aspect of the invention, the dielectric layer pattern has an ONO composition. Again, the dielectric layer is etched before impurities are implanted into the substrate. Preferably, the etching removes the nitride and second oxide layer of the ONO dielectric layer pattern, while the first oxide layer is left on the substrate.

Impurities implanted into the substrate, using the polysilicon layer pattern as a mask, form a preliminary source region having a width substantially identical to that of the exposed portion of the dielectric layer. Impurities may also be implanted into the substrate to form source/drain regions having lightly doped drain (LDD) structures.

In accordance with another aspect of the present invention, after a dielectric layer pattern having an ONO composition is formed on the substrate, the substrate by exposed the dielectric layer pattern is oxidized.

Preferably, the method of the invention is applied to the manufacturing of a non-volatile semiconductor memory device that includes an SONOS or a MONOS memory cell having a split structure.

According to the present invention, ion implantation processes are carried out using part of the dielectric layer pattern as a buffer layer. Therefore, a source region having a vertical profile can be formed as an enhancement for the programming efficiency of the non-volatile semiconductor memory device. In addition, the etch back process for forming the spacer of the gate is not used to also split the thick dielectric layer pattern. Accordingly, the etch back process does not damage a portion of a substrate corresponding to a drain region, which damage could otherwise give rise to leakage current in the semiconductor memory device. Thus, the reliability of the semiconductor memory device is improved.

BRIEF DESCRIPTION OF THE DRAWINGS

The above and other objects, features and advantages of the present invention will become more readily apparent from the following detailed description of the preferred embodiments thereof made in conjunction with the accompanying drawings, wherein.

DETAILED DESCRIPTION OF THE PREFERRED EMBODIMENTS

The present invention now will be described more fully hereinafter with reference to the accompanying drawings. Like reference numerals designate like elements throughout the drawings.

Figure 3:
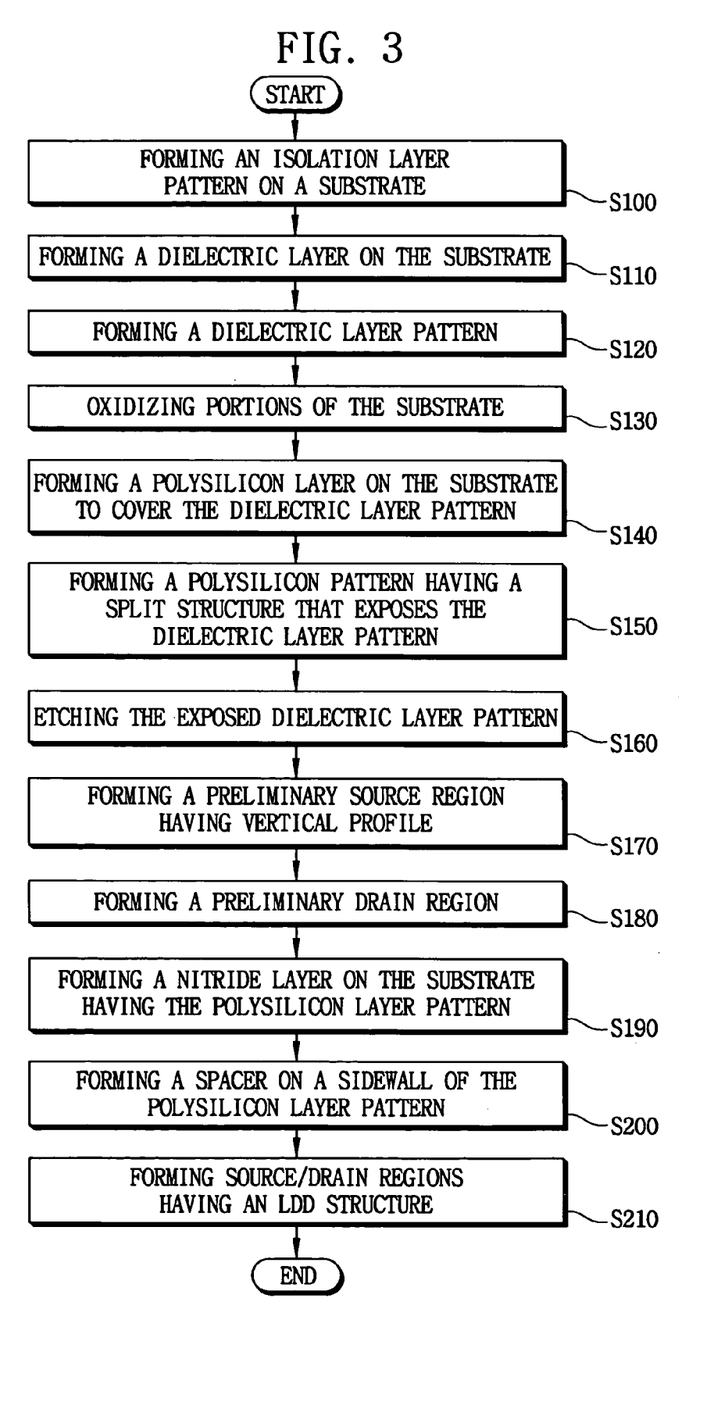
FIG. 3 is a flow chart illustrating a method of manufacturing an SONOS memory cell of a non-volatile semiconductor memory device according to the present invention.

Referring first to FIG. 3, an isolation layer pattern is formed on a semiconductor substrate by a shallow trench isolation (STI) process (step S100).

Next (step S110), a dielectric layer having an ONO structure is formed on the semiconductor substrate. The dielectric layer includes a first oxide film, a nitride film formed on the first oxide film, and a second oxide film formed on the nitride film. The first oxide film, the nitride film and the second oxide film have substantially identical thicknesses of about 20 to about 100 Å. Preferably, the first oxide film, the nitride film and the second oxide film each have a thickness of about 40 to about 70 Å.

A photoresist pattern is then formed on the dielectric layer, and the dielectric layer is patterned using the photoresist pattern as an etching mask to thereby form spaced apart portions of the dielectric layer pattern on the semiconductor substrate (step S120). Each portion of the dielectric layer pattern thus includes a first oxide film pattern, a nitride film pattern and a second oxide film pattern. The dielectric layer pattern traps electrons in the memory cell of the non-volatile semiconductor memory device.

Next, the first photoresist pattern is removed using ashing and stripping processes. Then, a gate oxide layer is formed on the semiconductor substrate by oxidizing a surface of the substrate exposed between the spaced-apart portions of the dielectric layer pattern (step S130).

Subsequently, a polysilicon layer having a uniform thickness is formed on the semiconductor substrate including over the dielectric layer pattern and the gate oxide layer (step S140). The polysilicon layer is formed by a low pressure chemical vapor deposition (LPCVD) process to a thickness of about 1,200 to about 1,800 Å. Preferably, the polysilicon layer has a thickness of about 1,500 Å.

Next, an etching mask is formed on the polysilicon layer. Then the polysilicon layer is etched using the etching mask to form a polysilicon layer pattern having a split structure that exposes a portion of the dielectric layer pattern (step S150). The polysilicon layer pattern will constitute the control gate of the memory cell of the non-volatile semiconductor memory device.

Subsequently, the etching mask is removed, and a second photoresist pattern that exposes a portion of the dielectric layer pattern is formed on the semiconductor substrate. The exposed portion of the dielectric layer pattern is etched a certain amount using the polysilicon layer pattern as an etching mask (step S160). That is, the exposed dielectric layer pattern is etched using a self-alignment etching process. At this time, the second oxide film pattern and the nitride film pattern of the exposed dielectric layer pattern are removed. However, a remaining portion of the exposed dielectric layer pattern, such as the first oxide film pattern, is left to serve as a buffer layer that protects the semiconductor substrate during an ion implantation process for forming source/drain regions. In addition, the remaining portion of the exposed dielectric layer pattern can prevent damage to the substrate, including to the drain region, when an etch back process is carried out to form a spacer on a sidewall of the polysilicon layer pattern.

Next (step S170), a first ion implantation process is performed on the semiconductor substrate using the second photoresist pattern and the polysilicon layer pattern as masks. Thus, a preliminary source region having vertical profile is formed at the portion of the semiconductor substrate where the remaining dielectric layer pattern is located. The preliminary source region is formed using impurities of Group III such as boron (B) with an energy of about 20 to about 50 KeV. The impurities of Group III are implanted by an angle of about 15 to about 45° to form the preliminary source region. Here, the preliminary source region has an impurity concentration of about $2 \times 10^{13}$ to about $4 \times 10^{13}$ atoms/cm$^2$. Alternatively, the preliminary source region is formed using impurities of Group V such as arsenic (As) with an energy of about 3 to about 15 KeV. The arsenic ions are implanted by an angle of about 0 to about 45° to form the preliminary source region. Here, the preliminary source region has an impurity concentration of about $2 \times 10^{15}$ to about $5 \times 10^{15}$ atoms/cm$^2$. Further, the preliminary source region is formed using impurities of Group V such as phosphorus (P) with an energy of about 10 to about 30 KeV. The phosphorus ions are implanted by an angle of about 30 to about 45° to form the preliminary source region. Here, the preliminary source region has an impurity concentration of about $0.5 \times 10^{13}$ to about $2 \times 10^{13}$ atoms/cm$^2$. This preliminary source region having a vertical profile enhances the programming efficiency of the non-volatile semiconductor memory device. According to the present invention, the first ion implantation process may be performed at relatively low energy in comparison with the conventional process because the first ion implantation process is performed while part of the dielectric layer pattern remains on the substrate. Therefore, the preliminary source region has a width substantially identical to that of the exposed dielectric layer pattern, and also the preliminary source region has a vertical profile. As a result, the width of the channel region of the semiconductor memory device is not altered. Also, the first oxide film pattern of the exposed dielectric layer pattern is removed during the first ion implantation process.

Then, the second photoresist pattern is removed by ashing and stripping processes, and a third photoresist pattern is formed on the substrate to expose a portion of the substrate where the drain region is to be formed. A second ion implantation process is performed to form a preliminary drain region having a split structure using the third photoresist pattern as a mask (step S180). The preliminary drain region is formed using impurities of Group V.

The third photoresist pattern is then removed by ashing and stripping processes, whereupon a nitride layer, e.g., a silicon nitride (SiN) layer, is formed on the resultant structure (step 190). The nitride layer is formed to a thickness of about 500 to about 1,000 Å using an LPCVD process. Preferably, the nitride layer has a thickness of about 700 Å.

Next, an etch back process is carried out on the nitride layer to thereby form a spacer on the sidewall of the polysilicon layer pattern (step S200).

Finally (step S210), a third ion implantation process is performed on the preliminary source/drain regions using the polysilicon layer pattern and spacer as a mask. The third ion implantation process is carried out using impurities of Group V. Thus, lightly-doped source/drain regions having vertical profiles are formed on the substrate. The third ion implantation is performed with a relatively high energy of about 20 to about 50 KeV.

FIGS. 4A to 4L illustrate, in more detail, a method of manufacturing a split-structured SONOS memory cell of a non-volatile semiconductor memory device according to the present invention.

Figure 4A:
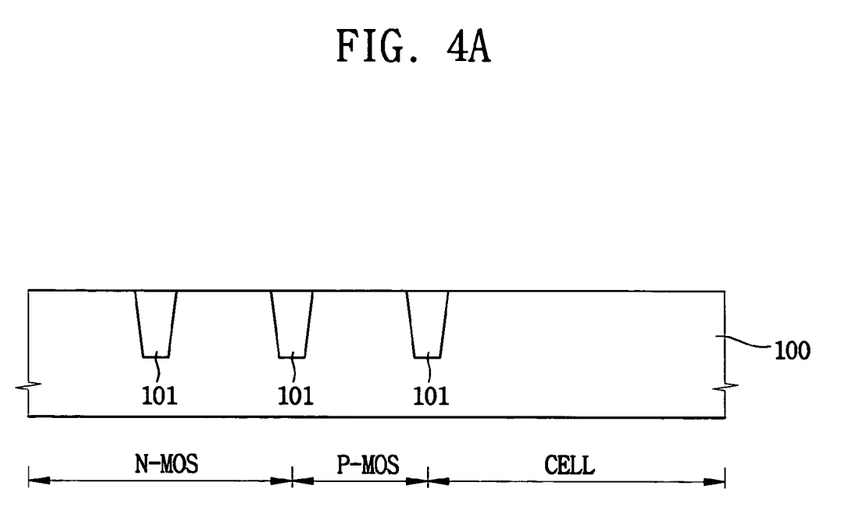
FIGS. 4A to 4L are cross-sectional views of a substrate, illustrating the method of manufacturing a split-structured SONOS memory cell of a non-volatile semiconductor memory device according to the present invention.

Referring to FIG. 4A, isolation layer patterns 101 are formed on a silicon semiconductor substrate 100 by an STI process. Thus, the semiconductor substrate 100 is divided into a P-MOS region, an N-MOS region, and a cell region.

Figure 4B:
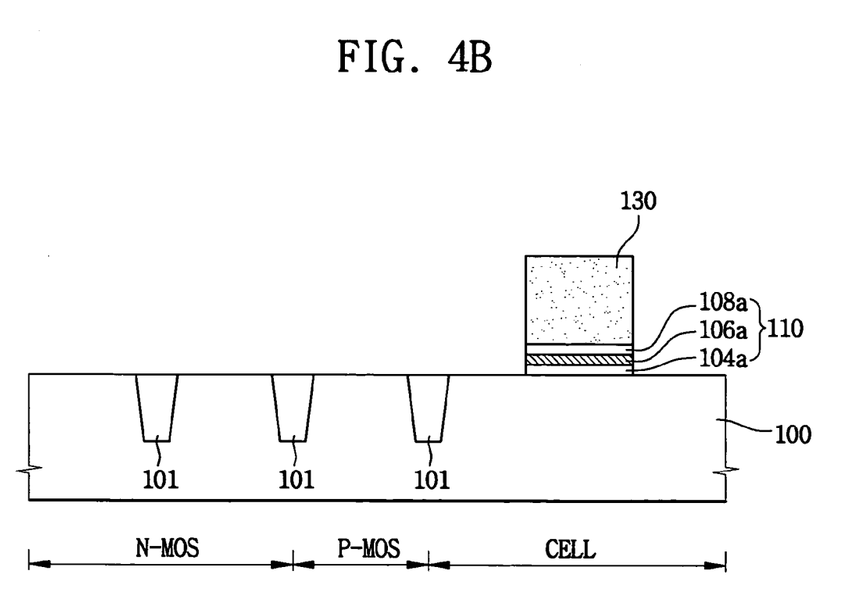

Referring to FIG. 4B, a dielectric layer is formed on the substrate 100. The dielectric layer has an ONO structure in which a first oxide film, a nitride film, and a second oxide film are sequentially formed one atop the other. Alternatively, the dielectric layer 110 may comprise an oxynitride film instead of the first oxide film. A first photoresist pattern 130 is formed on the cell region of the substrate 100. The dielectric layer is dry etched using the first photoresist pattern 130 as an etching mask so that a dielectric layer pattern 110 is formed in the cell region of the substrate 100 only. The dielectric layer pattern 110 includes a first oxide film pattern 104a, a nitride film pattern 106a, and a second oxide film pattern 108a. The first oxide film pattern 104a has a thickness of about 40 Å, and the second oxide film pattern 108a has a thickness of about 50 to about 100 Å. The nitride film pattern 106a has a thickness of about 40 to about 60 Å.

Figure 4C:
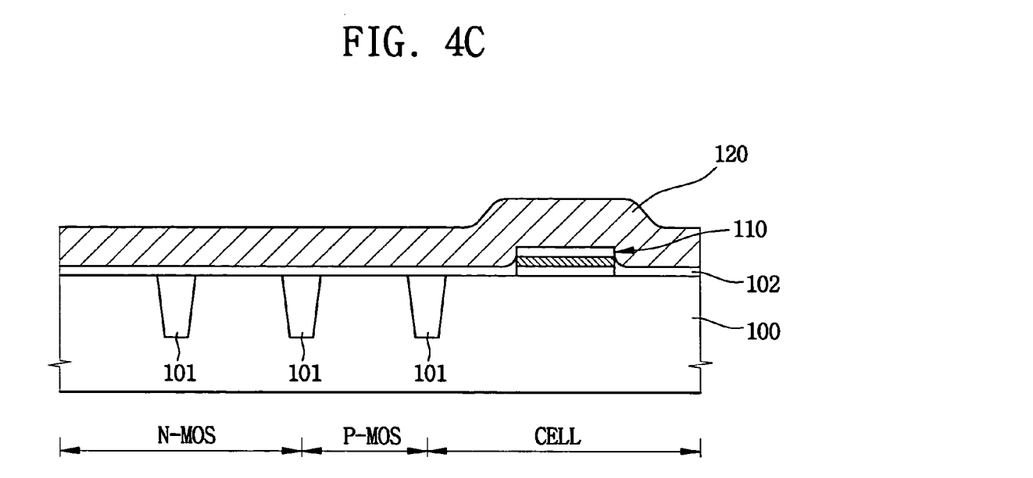

Referring to FIG. 4C, the first photoresist pattern 130 is removed using ashing and stripping processes. Then, a portion of the substrate 100 exposed by the dielectric layer pattern 110 is oxidized to form an oxide layer thereon. Thus, a gate oxide layer 102 is formed on the exposed portion of the substrate 100 corresponding to logic regions such as the P-MOS region and the N-MOS region. Alternatively, an oxynitride layer is formed on the exposed portion of the substrate 100.

A polysilicon layer 120 having a uniform thickness is formed on the dielectric layer pattern 110 and on the gate oxide layer 102. The polysilicon layer 120 is formed to a thickness of about 1,500 Å using an LPCVD process. An anti-reflection layer (ARL) (not shown) may be formed on the polysilicon layer 120. In that case, the ARL has a thickness of about 700 Å.

Figure 4D:
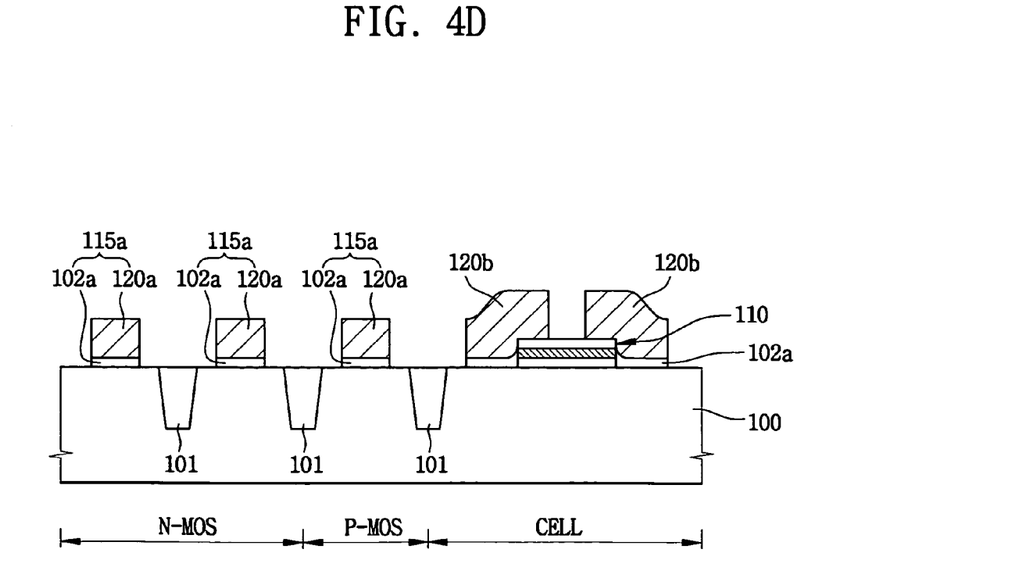

Referring to FIG. 4D, an etching mask (not shown) is formed on the polysilicon layer 120. The polysilicon layer 120 and the gate oxide layer 102 exposed by the etching mask are dry etched to form gate electrodes 115a in the N-MOS and P-MOS regions and a split second polysilicon layer pattern 120b in the cell region. Here, each of the gate electrodes 115a includes a first polysilicon layer pattern 120a and a gate oxide layer pattern 102a. The split second polysilicon layer pattern 120b in the cell region constitutes a control gate of the memory cell. The etching mask is then removed. Next, the split second polysilicon layer pattern 120b is oxidized to thereby form native oxide films (not shown) on the split second polysilicon layer pattern 120b.

Figure 4E:
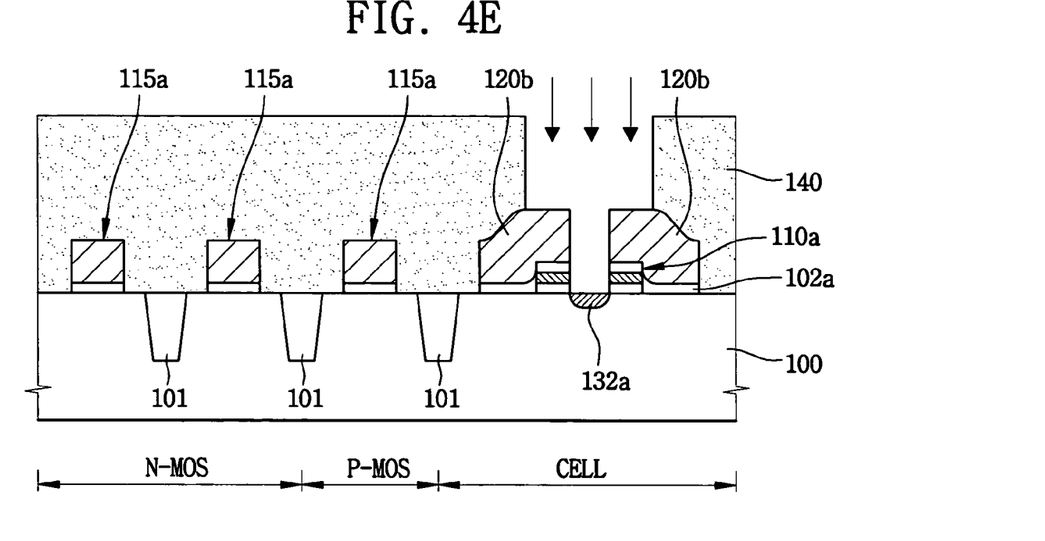

Referring to FIG. 4E, a second photoresist pattern 140 is formed on the substrate 100, the gate electrodes 115a and the split second polysilicon layer pattern 120b. The second photoresist pattern 140 exposes portions of the second polysilicon layer pattern 120b. Hence, part of the dielectric layer pattern 110 is exposed through the split second polysilicon layer pattern 120b and the second photoresist pattern 140.

The exposed part of the dielectric layer pattern 110 is etched by a self-aligning etching process in which the split second polysilicon layer pattern 120b is used as an etching mask. At this time, the exposed portions of the second oxide film pattern 108a and the first nitride film pattern 106a are removed while the remainder of the dielectric layer pattern, e.g., the exposed portion of the first oxide film pattern 104a, is left on the substrate 100.

The remainder of the exposed dielectric layer pattern serves as a buffer layer that prevents the substrate 100 from being damaged when a subsequent ion implantation process is carried out to form a source region. In addition, the remainder of the exposed dielectric layer pattern prevents a portion of the substrate 100 corresponding to a drain region from being damaged when a an etch back process is performed to form a spacer 135 (see FIG. 4I) and simultaneously expose a portion of the substrate 100 where the drain region is formed.

A first ion implantation process is then performed using the second photoresist pattern 140 and the split second polysilicon layer pattern 120b as masks. In particular, the first ion implantation process is carried out with an energy of about 5 to about 10 KeV using impurities such as arsenic ions (As). As a result, a preliminary source region 132a having a vertical profile is formed in the cell region of the substrate 100. The preliminary source region 132a has a width substantially similar to that of the gap between the respective portions of the split second polysilicon layer pattern 120b. Moreover, the first oxide film pattern 104a of the dielectric layer pattern is removed during the first ion implantation process, thereby forming a dielectric pattern 110a having a split structure.

Figure 4F:
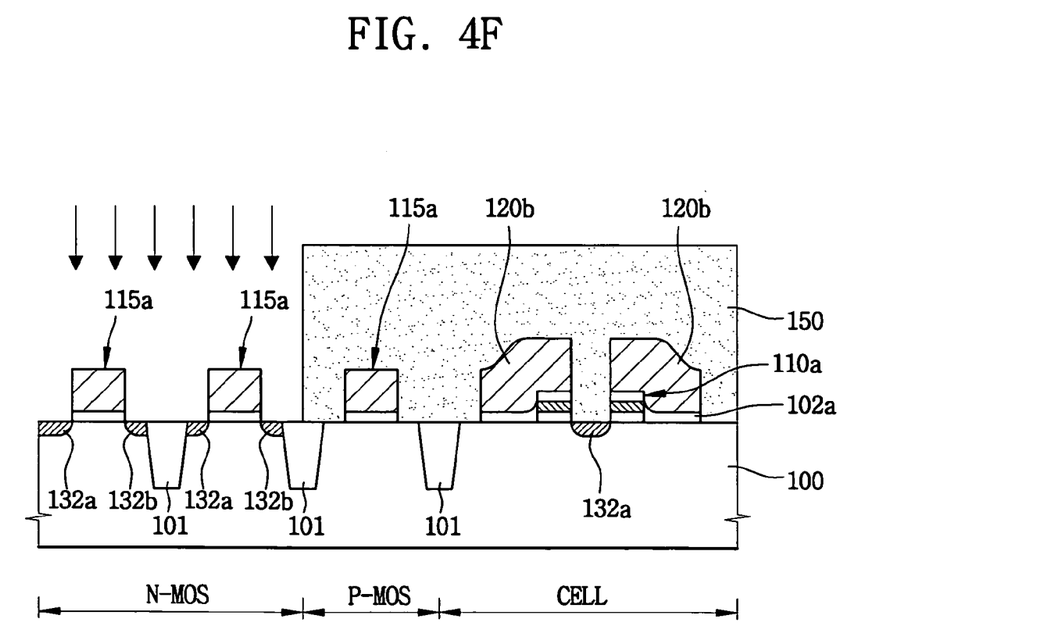

Referring to FIG. 4F, the second photoresist pattern 140 is removed using ashing and stripping processes, whereupon a third photoresist pattern 150 is formed on the substrate 100 to expose the N-MOS region, and to partially expose the cell region of the substrate 100. A second ion implantation process is carried out with an energy of about 15 to about 25 KeV using the third photoresist pattern 150 and the gate electrodes 115a in the N-MOS region as masks. Thus, preliminary source/drain regions 132a and 132b are formed at portions of the substrate 100 exposed between the gate electrodes 115a in the N-MOS region. A preliminary drain region 132b of the cell region is formed. In this case, the preliminary source/drain regions 132a and 132b are formed using impurities such as phosphorus (P) ions.

Figure 4G:
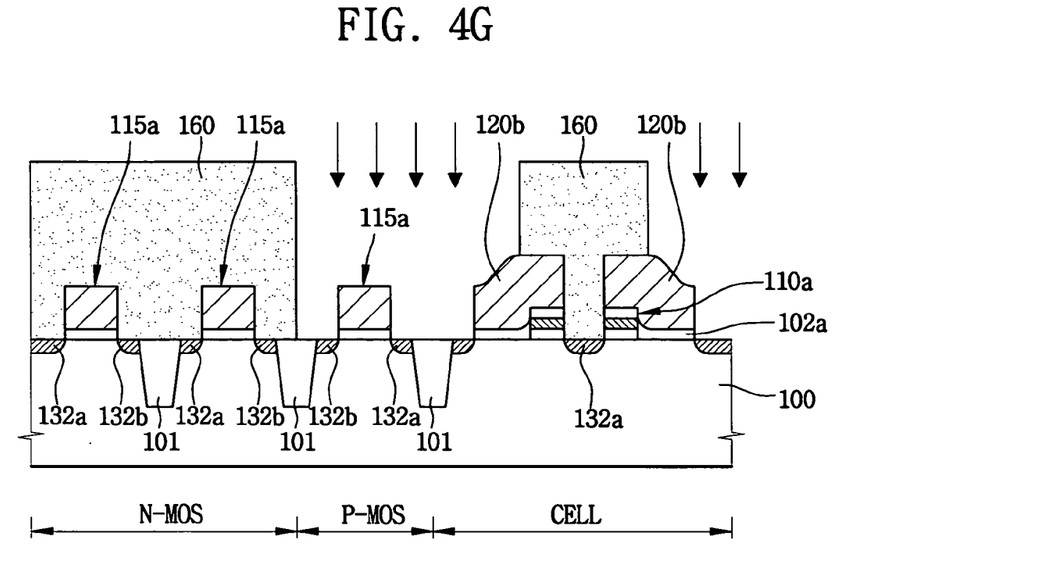

Referring to FIG. 4G, the third photoresist pattern 150 is removed using ashing and stripping processes, and then a fourth photoresist pattern 160 is formed on the substrate 100 to expose the P-MOS region of the substrate 100 only. A third ion implantation process is performed with an energy of about 15 to about 25 KeV using the gate electrodes 115a in the P-MOS region as masks. Thus, preliminary source/drain regions 132a and 132b are formed at portions of the substrate 100 exposed between the gate electrodes 115a in the P-MOS region. In this case, the preliminary source/drain regions 132a and 132b are formed using impurities such as boron (B) ions.

Figure 4H:
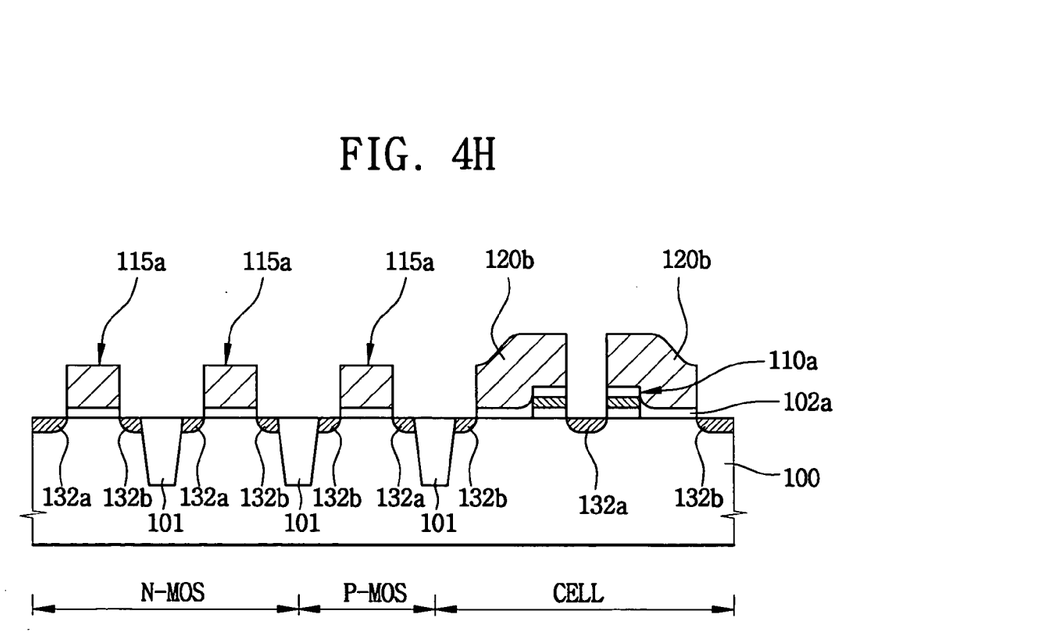
Figure 4I:
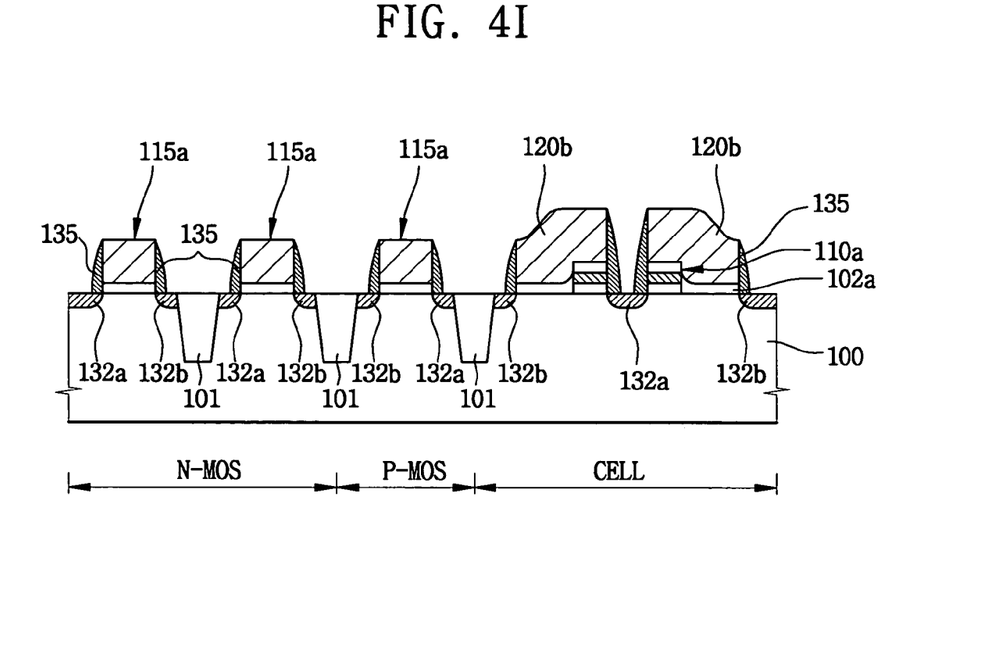

Referring to FIGS. 4H and 4I, the fourth photoresist pattern 160 is removed using ashing and stripping processes. Then, a nitride layer, e.g., a layer of silicon nitride (SiN), is formed on the substrate 100 including over the gate electrodes 115a and on the split second polysilicon layer pattern 120b. The nitride layer has a thickness of about 700 Å.

The nitride layer is etched back to thereby form spacers 135 on sidewalls of the gate electrodes 115a in the P-MOS and N-MOS regions, respectively. At the same time, a spacer 135 is formed on a sidewall of the split second polysilicon layer pattern 120b in the cell region. Also, a buffer layer having a thickness of about 100 Å may be formed on the substrate 100 before the nitride layer to prevent the substrate 100 from being damaged during the etch back process for forming the spacers 135.

Figure 4J:
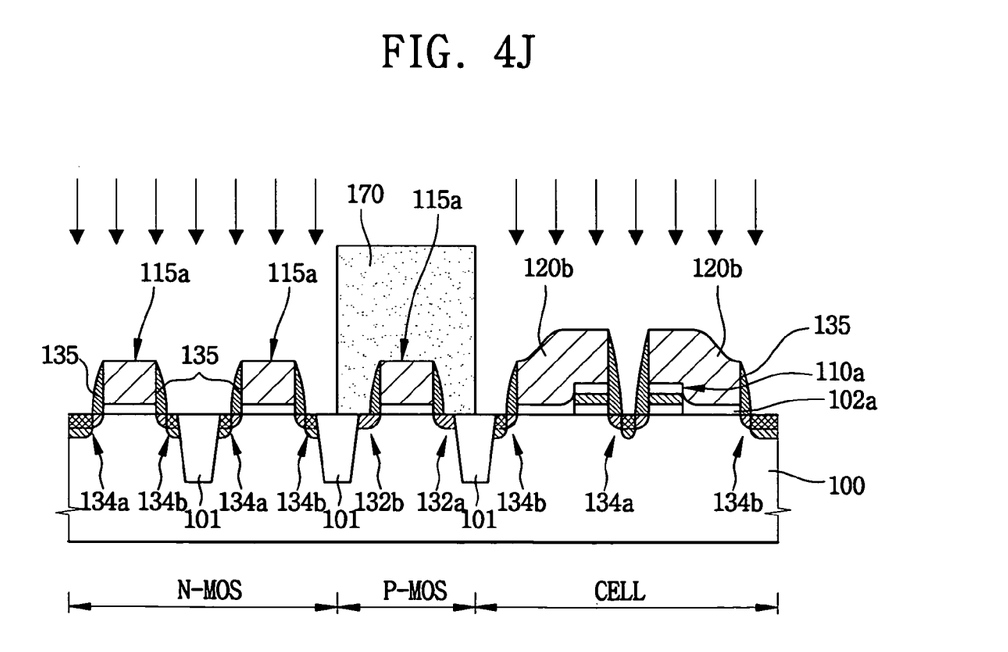

Referring to FIG. 4J, a fifth photoresist pattern 170 is formed on the substrate 100 to cover the P-MOS region only. A fourth ion implantation process is performed with an energy of about 30 to about 40 KeV using the gate electrodes 115a including the spacers 135 in the N-MOS region and the split second photoresist pattern 120b including the spacers 135 as masks. Thus, source/drain regions 134a and 134b are formed at portions of the substrate 100 exposed between the gate electrodes 115a and the split second polysilicon layer patterns 120b in the N-MOS and cell regions. The source/drain regions 134a and 134b are formed as lightly doped regions using impurities such as arsenic ions.

Figure 4K:
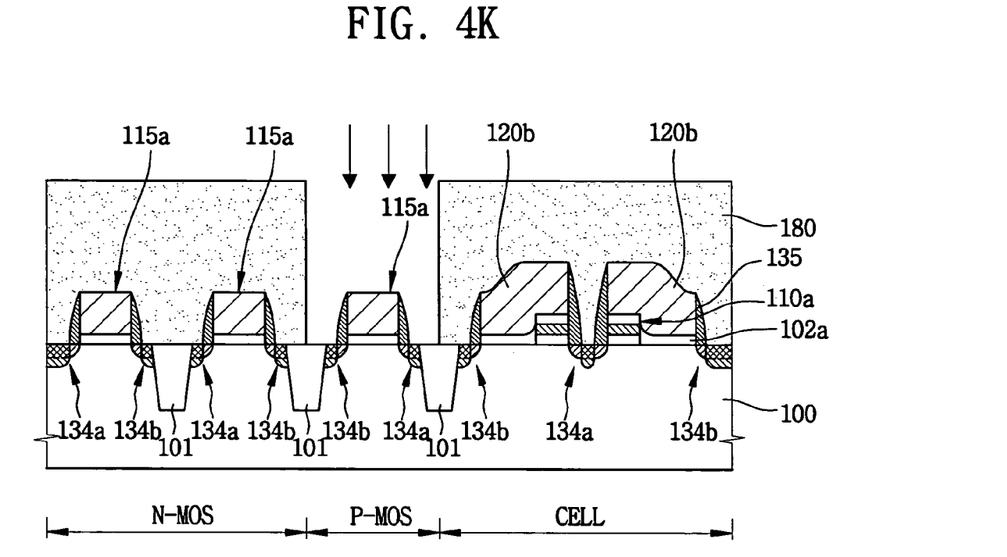
Figure 4L:
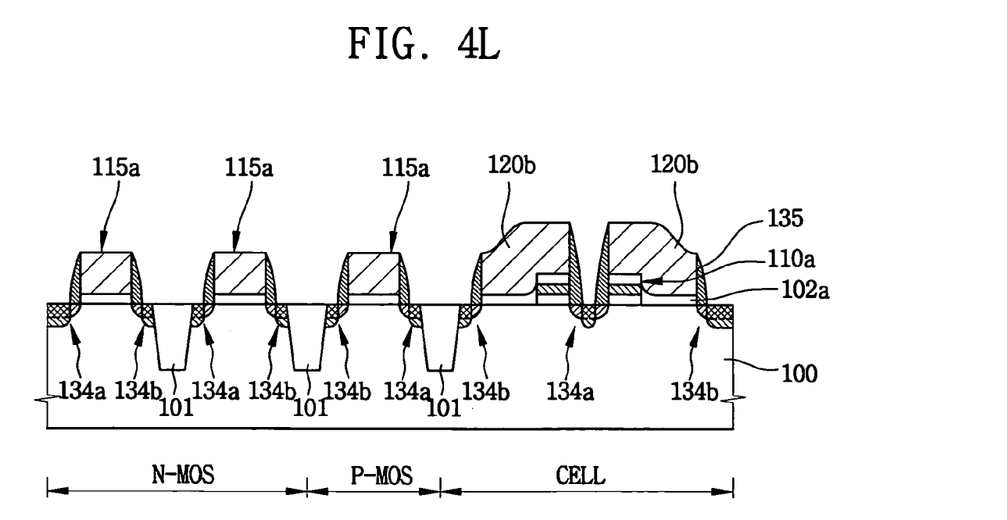

Referring to FIGS. 4K and 4L, the fifth photoresist pattern 170 is removed using ashing and stripping processes, whereupon a sixth photoresist pattern 180 is formed on the substrate 100 to expose the P-MOS region of the substrate 100 only. That is, the sixth photoresist pattern 180 covers the N-MOS and cell region of the substrate 100. A fifth ion implantation process is carried out with an energy of about 3 to about 5 KeV using the gate electrodes 115a including the spacers 135 in the P-MOS region as masks, thereby forming source/drain regions 134a and 134b at portions of the substrate 100 between the gate electrodes 115a in the P-MOS region. The source/drain regions 134a and 134b are formed using impurities such as boron ions at a relatively high concentration.

As described above, the dielectric layer pattern exposed by a polysilicon layer pattern is etched prior to the ion implantation processes. Therefore, a source region can be formed using a portion of the dielectric layer pattern as a buffer layer, whereby the source region attains a vertical profile and enhances the programming efficiency of the non-volatile semiconductor memory device.

In addition, a gate spacer can be formed without splitting the dielectric layer pattern at the same time. Thus, the portion of the substrate corresponding to a drain region is effectively prevented from being damaged thereby reducing the possibility of leakage current occurring in the semiconductor memory device. Thus, the reliability of the semiconductor memory device is improved.

The present invention is particularly applicable to the manufacturing of a non-volatile semiconductor memory device that has an SONOS or a MONOS split gate structure, wherein a dielectric layer pattern having the ONO composition exists at the portion of the semiconductor substrate beneath the control gate. The source region can be formed with a relatively low ion implantation energy compared to the conventional process. Hence, the source region of the split gate can have a vertical profile that allows for a wider channel region beneath the gate.

Finally, although the present invention has been described above in connection with the preferred embodiments thereof, modifications and variations will become apparent in light of the above teachings to those skilled in the art. Therefore the disclosed embodiments of the present invention can be changed and modified within the true spirit and scope of the invention as defined by the appended claims.

What is claimed is:

1. A method of manufacturing a non-volatile semiconductor memory device, comprising:
   forming a dielectric layer pattern having an ONO composition on a surface of a substrate, wherein the dielectric layer pattern extends over only a portion of the surface of the substrate;
   forming a polysilicon layer on the substrate including over the dielectric layer pattern;
   patterning the polysilicon layer to form a polysilicon layer pattern on the dielectric layer pattern, wherein the polysilicon layer pattern has a split structure that exposes a portion of the dielectric layer pattern;
   etching the exposed portion of the dielectric layer pattern; and
   subsequently implanting impurities into the substrate to form source/drain regions in the substrate.

2. The method of claim 1, wherein said forming of the dielectric layer pattern comprises:
   forming a first oxide film having a thickness of about 20 to about 100 Å on the substrate,
   forming a nitride film having a thickness of about 20 to about 100 Å on the first oxide film,
   forming a second oxide film having a thickness of about 20 to about 100 Å on the nitride film,
   forming an etching mask on the second oxide film, and
   etching the second oxide film, the nitride film and the first oxide film using the etching mask.

3. The method of claim 1, and further comprising forming a gate oxide film on the substrate by oxidizing a surface of the substrate after the dielectric layer pattern is formed.

4. The method of claim 1, further comprising oxidizing a surface of the polysilicon layer pattern.

5. The method of claim 1, wherein said etching of the exposed portion of the dielectric layer pattern comprises removing only some of the entire thickness of the exposed portion of the dielectric layer pattern, wherein a remainder of the portion of the dielectric layer pattern, exposed by the split polysilicon layer pattern, is left on the substrate.

6. The method of claim 1, wherein said implanting of ions comprises a first implantation process using the polysilicon layer pattern as a mask to form a source region in the substrate having a vertical profile and a width substantially identical to the width of the exposed portion of the dielectric layer.

7. The method of claim 1, wherein said implanting of ions comprises:
   forming preliminary source/drain regions at portions of the substrate exposed by the polysilicon layer pattern,
   subsequently forming a nitride layer on the substrate including over the polysilicon layer pattern,
   etching back the nitride layer to form a spacer on a sidewall of the polysilicon layer pattern, and
   subsequently forming lightly doped drain (LDD) structures using the polysilicon layer pattern and the spacer as a mask.

8. The method of claim 7, wherein said forming of the preliminary source/drain regions is performed by implanting impurities of Group V with a relatively low ion implantation energy of about 3 to about 15 KeV, and said forming of the lightly doped drain (LDD) structures is performed by implanting impurities of Group V with a relatively high ion implantation energy of about 20 to about 50 KeV.

9. A method of manufacturing a non-volatile semiconductor memory device, comprising:
   forming a dielectric layer pattern having an ONO composition on a substrate;
   oxidizing portions of the substrate exposed by the dielectric layer pattern;
   subsequently forming a polysilicon layer on the substrate including over the dielectric layer pattern;
   patterning the polysilicon layer to form a polysilicon layer pattern on the dielectric layer pattern, wherein the polysilicon layer pattern has a split structure that exposes a portion of the dielectric layer pattern;
   etching the exposed portion of the dielectric layer pattern;
   subsequently implanting ions into the substrate to form preliminary source/drain regions in the substrate;
   subsequently forming a spacer on a sidewall of the polysilicon layer pattern; and
   subsequently implanting ions into the substrate using the polysilicon layer pattern and the spacer as a mask to form lightly doped drain (LDD) structures.

10. The method of claim 9, wherein said forming the dielectric layer pattern comprises:
    forming a first oxide film having a thickness of about 20 to about 100 Å on the substrate,
    forming a nitride film having a thickness of about 20 to about 100 Å on the first oxide film,
    forming a second oxide film having a thickness of about 20 to about 100 Å on the nitride film,
    forming an etching mask on the second oxide film, and
    etching the second oxide film, the nitride film and the first oxide film using the etching mask.

11. The method of claim 9, further comprising oxidizing a surface of the polysilicon layer pattern.

12. The method of claim 9, wherein said etching of the exposed portion of the dielectric layer pattern comprises removing only some of the entire thickness of the exposed portion of the dielectric layer pattern, wherein a remainder of the portion of the dielectric layer pattern, exposed by the split polysilicon layer pattern, is left on the substrate.

13. The method of claim 9, wherein said forming of the spacer comprises:
    forming a nitride layer on the substrate including over the polysilicon layer pattern, and
    etching back the nitride layer.

14. The method of claim 9, wherein said forming of the preliminary source/drain regions is performed by implanting impurities of Group V with a relatively low ion implantation energy of about 3 to about 15 KeV, and said forming of the lightly doped drain (LDD) structures is performed by implanting impurities of Group V with a relatively high ion implantation energy of about 20 to about 50 KeV.

15. A method of manufacturing a non-volatile semiconductor memory device, comprising:
    forming a dielectric layer pattern on a substrate;
    forming a gate layer on the substrate including over the dielectric layer pattern;

patterning the gate layer to form a gate layer pattern on the dielectric layer pattern, wherein the gate layer pattern has a split structure that exposes a portion of the dielectric layer pattern;

removing only some of the entire thickness of the exposed portion of the dielectric layer pattern, wherein a remainder of the portion of the dielectric layer pattern, exposed by the split gate layer pattern, is left on the substrate;

subsequently implanting impurities into the substrate using the split gate layer pattern as a mask to form a source region in the substrate.

16. The method of claim 15, wherein said implanting of impurities removes said remainder of the portion of the dielectric layer pattern.

17. The method of claim 15, further comprising:

subsequently forming a nitride layer on the substrate including over the split gate layer pattern, etching back the nitride layer to form a spacer on a sidewall of the gate layer pattern, and implanting ions into the substrate using the gate layer pattern and the spacer as a mask.

18. The method of claim 16, further comprising:

subsequently forming a nitride layer on the substrate including over the gate layer pattern, etching back the nitride layer to form a spacer on a sidewall of the gate layer pattern, and implanting ions into the substrate using the gate layer pattern and the spacer as a mask.

19. The method of claim 15, wherein said forming of the dielectric layer pattern comprises forming a first oxide or oxynitride layer, a nitride layer, and a second oxide layer one atop the other.

20. The method of claim 19, wherein said removing only some of the entire thickness of the exposed portion of the dielectric layer pattern comprises removing only said second oxide layer and said nitride layer, wherein the remainder of the dielectric pattern on the substrate serves as a buffer layer during the implanting of ions to form the source region.

21. The method of claim 1, wherein said forming of a dielectric layer pattern on a surface of a substrate comprises forming a layer having an ONO composition over the entirety of the surface of the substrate, and subsequently patterning the layer, and said forming a polysilicon layer on the substrate comprises forming a layer of polysilicon over the entirety of the surface of the substrate so as to cover the dielectric layer pattern.

* * * * *